United States Patent [19]

Nakano et al.

[11] Patent Number: 5,336,736

[45] Date of Patent: Aug. 9, 1994

[54] POLYSILANE AND POLYSILANE COMPOSITION

[75] Inventors: Yoshihiko Nakano, Tokyo; Shuzi Hayase, Kawasaki; Shinji Murai, Yokohama; Yukihiro Mikogami, Yokohama; Akira Yoshizumi, Yokohama, all of Japan

[73] Assignee: Kabushiki Kaisha Toshiba, Kawasaki, Japan

[21] Appl. No.: 53,810

[22] Filed: Apr. 29, 1993

Related U.S. Application Data

[63] Continuation of Ser. No. 858,867, Mar. 27, 1992, abandoned.

[30] Foreign Application Priority Data

Mar. 29, 1991 [JP] Japan ................................. 3-91613
Oct. 24, 1991 [JP] Japan ................................. 3-278028

[51] Int. Cl.$^5$ ........................................... C08F 283/00
[52] U.S. Cl. ................................. 525/474; 525/476; 528/26; 528/27
[58] Field of Search .................... 528/26, 27; 525/476, 525/474

[56] References Cited

U.S. PATENT DOCUMENTS 4,871,646 10/1989 Hayase et al. .................... 430/272

FOREIGN PATENT DOCUMENTS 0231497 8/1987 European Pat. Off. .
3817306 12/1988 Fed. Rep. of Germany .
2616152 12/1988 France .
63-113021 5/1988 Japan .
6456732 3/1989 Japan .

OTHER PUBLICATIONS

Macromolecules, vol. 22, No. 7, Jul. 22, 1989, pp. 2933-2938, S. Hayase, et al., "Synthesis of Polysilanes with Functional Groups. 2. Polysilanes with Carboxylic Acids".
Journal of Polymer Science-Polymer Chemistry Edition, vol. 27, No. 9, Aug. 27, 1989, pp. 2861-2869, H. Qui, et al., "Organosilane Polymers: Formable Polymers Containing Reactive Side Groups".
Journal of American Chemical Society, 1988, 110, pp. 2342-2344, P. A. Bianconi, et al., "Poly(n-hexylsilyne): Synthesis and Properties of the First Alkyl Silicon [RSi]n Network Polymer".

Primary Examiner—Melvyn I. Marquis
Attorney, Agent, or Firm—Oblon, Spivak, McClelland, Maier & Neustadt

[57] ABSTRACT

Disclosed is a polysilane having a repeating unit represented by general formula (1) given below. Also disclosed is a polysilane composition, comprising a polysilane having a repeating unit represented by general formula (2) given below and a cross linking agent:

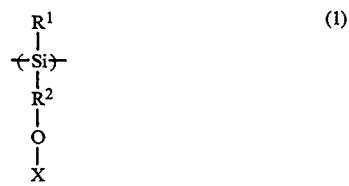

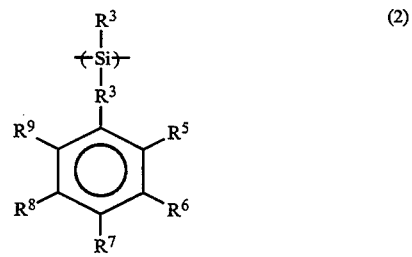

where, each of $R^1$ and $R^3$ is hydrogen, a substituted or unsubstituted alkyl group having 1 to 24 carbon atoms or a substituted or unsubstituted aryl group having 6 to 24 carbon atoms; $R^2$ is a divalent hydrocarbon group having to 24 carbon atoms which can be substituted; $R^4$ is a covalent bond, or a substituted or unsubstituted alkylene group having 1 to carbon atoms, or a substituted or unsubstituted arylene group having 6 to 24 carbon atoms; each of $R^5$ to $R^9$ is hydrogen, a substituted or unsubstituted alkyl group having 1 to 24 carbon atoms, a substituted or unsubstituted aryl group having 6 to 24 carbon atoms, or hydroxyl group, at least one of $R^5$ to $R^9$ being hydroxyl group; and X is a monovalent organic group having a reactive group capable of crosslinking upon exposure to light or by heating. If any of the polysilane and the polysilane composition of the present invention is exposed to light or heated, the polysilane molecules are crosslinked so as to provide a two or three dimensional polymer.

15 Claims, No Drawings

POLYSILANE AND POLYSILANE COMPOSITION

This application is a continuation of application Ser. No. 07/858,867, filed on Mar. 27, 1992, now abandoned.

BACKGROUND OF THE INVENTION

1. Field of the Invention

The present invention relates to a polysilane capable of crosslinking to form a two dimensional or three dimensional polymer. The invention also relates to a composition which contains a polysilane incapable of crosslinking by itself, but is capable of forming such a polymer.

2. Description of the Related Art

Vigorous researches are being made on the application of a polysilane in various fields such as a precursor of a ceramic material, an electrically conductive material, a photoconductive material, a semiconductor material and a non-linear optical material. Of course, the polysilane is a highly interesting material in the industry.

The polysilane which has attracted attentions in the past has in general hydrophobic side chains such as an alkyl group and a phenyl group bonded to the Si—Si backbone, that is to say, the Si—Si main chain. On the other hand, polysilanes having a polar group in the side chain are also disclosed in, for example, "Macromolecule, 22 (1989), page 293", "Macromolecule, 21 (1988), page 304", and Published Unexamined Japanese Patent Application No. 1-311102. Polysilanes having a polar group in the side chain exhibit an excellent affinity with an organic solvent and, thus, can be dissolved in the organic solvent to form a solution. It follows that the polysilanes having a polar group in the side chain can be processed easily to various materials exemplied above. For example, a thin film of such a polysilane can be formed by means of a rotary coating method.

However, the polysilane which attracted attentions in the past has a substantially one dimensional molecular structure, i.e., a linear structure. It follows that, when formed into, for example, a thin film, the bond strength between the polysilane thin film and the substrate is low. Also, the conventional polysilane has in general a low glass transition point Tg. It follows that the polysilane is insufficient in its heat resistance. Besides, the conventional polysilane is poor in its wear resistance. Therefore, it is necessary to solve various problems before the conventional polysllane is put to a practical use.

SUMMARY OF THE INVENTION

An object of the present invention is to provide a polysllane which has a high affinity with an organic solvent, which can be easily formed into, for example, a thin film, which can be crosslinked into a two or three dimensional molecular structure so as to form a cured material, and which exhibits, when cured in the form of a thin film, excellent bond strength with the substrate, mechanical strength and heat resistance.

According to one embodiment of the present invention, there is provided a polysilane having a repeating unit represented by general formula (1) given below:

where, $R^1$ is hydrogen, a substituted or unsubstituted alkyl group having 1 to 24 carbon atoms, or a substituted or unsubstituted aryl group having 6 to carbon atoms; $R^2$ is a divalent hydrocarbon group having 1 to 24 carbon atoms which can be substituted; and X is a monovalent organic group having a reactive group which permits crosslinking upon exposure to light or by heating.

According to another embodiment of the present invention, there is provided a polysilane composition, comprising a polysilane having a repeating unit represented by general formula (2) given below and a crosslinking agent:

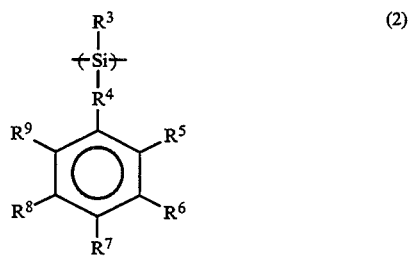

where $R^3$ is hydrogen, a substituted or unsubstituted alkyl group having 1 to 24 carbon atoms, or a substituted or unsubstituted aryl group having 6 to 24 carbon atoms; $R^4$ is a covalent bond, of a substituted or unsubstituted alkylene group having 1 to 24 carbon atoms, or a substituted or unsubstituted arylene group having 6 to 24 carbon atoms; and each of $R^5$ to $R^9$ is hydrogen, hydroxyl group, a substituted or unsubstituted alkyl group having 1 to 24 carbon atoms, or a substituted or unsubstituted aryl group having 6 to 24 carbon atoms, at least one of $R^5$ to $R^9$ being hydroxyl group.

In the polysilane having a repeating unit (1) of the present invention, the molecules of said polysilane can be crosslinked when heated or exposed to light so as to synthesize a two or three dimensional polymer. Likewise, in the polysilane having a repeating unit (2), which is contained in the polysilane composition of the present invention, the molecules of said polysilane can be also crosslinked when heated or exposed to light so as to synthesize a two or three dimensional polymer. When it comes to the polysilane having a repeating unit (1), the reactive group in group X of one polysilane molecule carries out a reaction with the same of the other molecule when heated or exposed to light so as to achieve crosslinking between the polysilane molecules. In the case of the polysilane having a repeating unit (2), the crosslinking agent contained in the polysilane composition permits crosslinking between the polysilane molecules upon heating or light exposure. In this fashion, a cured material of a polysilane having a two or three dimensional molecular structure, that is to say, a two or three dimensional polysilane can be formed without difficulty.

The cured material of the polysilane formed in the present invention exhibits prominent properties such as a high mechanical strength. For example, the polysilane having a repeating unit (1) or the polysilane composition containing a polysllane having a repeating unit (2), which are specified in the present invention, can be formed into a thin film on a substrate. The polysilane thin film thus formed can be easily cured by heating or light exposure so as to obtain a cured polysilane thin film, i.e., a thin film of a polysilane having a two or three dimensional molecular structure. What should be noted is that the cured polysilane thin film thus obtained exhibits excellent properties including, for example, a high adhesion strength with the substrate, a high mechanical strength and a high heat resistance. It is possible to employ an ordinary film-forming process for forming the cured polysilane thin film noted above. It should be noted that the polysilanes have a polar atomic Group such as an ester linkage and phenolic hydroxyl group and, thus, can be dissolved in an organic solvent. It follows that the process of forming, for example, a cured polysilane thin film can be performed very easily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

The present invention provides a polysilane having, a repeating unit (1), described previously. As seen from the general formula, the polysilane has a Si—Si backbone and two kinds of side chains, i.e., pendant groups bonded to the backbone. What should be noted is that an organic group having a reactive group which performs a crosslinking reaction upon light exposure or heat treatment is introduced into one of these side chains, The reactive group noted above denotes a group capable of polymerization upon exposure to light, radiation, etc. or by heating. In other words, the reactive group is a photopolymerizable group or a heat-polymerizable group. The reactive group in the side chain of the polysilane defined in the present invention includes epoxy group and unsaturated groups such as, vinyl, acryloyl (acryl), methacryloyl, (methacryl), acetyl and maleimide group. The polysilane of the present invention having a repeating unit (1), i.e., a polysilane having such an organic group in side chains, can be easily synthesized by, for example, a dehydrohalogenation reaction or a ring-opening reaction between a polysilane having a repeating unit (1*) given below, i.e., a polysilane having a hydroxyl group in a side chain, and a compound having such a reactive group as exemplified above:

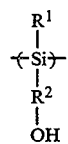

(1*)

where $R^1$ and $R^2$ are the same as defined in repeating unit (1).

In synthesizing a polysilane having a repeating unit (1) by the reaction exemplified above, unreacted hydroxyl groups are left in general in some of the side chains of the resultant polysilane. In other words, the polysilane having a repeating unit (1) defined in the present invention is in many cases a copolymer including both the repeating unit (1) and the other repeating unit (1*) noted above. In this copolymer, the content of the repeating unit (1*) should be desirably 5 to 99% based on the total amount of the copolymer. It is possible to control as desired the content of the repeating unit (1*) in accordance with the use of the polysilane. Further, it is possible for the polysilane of the present invention having a repeating unit (1) to be a copolymer further having a repeating unit of another chemical structure together with the repeating unit (1).

In the polysilane of the present invention, a hydrophilic group having the reactive group described previously is introduced into one side chain bonded to the Si—Si backbone, as apparent from general formula (1) representing the repeating unit of the polysilane. On the other hand, a hydrophobic group such as an alkyl group or an aryl group is introduced into the other side chain bonded to Si—Si backbone, said hydrophobic group being unsubstituted or substituted by, for example, fluorine. Alternatively, it is possible for the hydrophilic groups each having a reactive group to be introduced into the both side chains in the polysilane. Table A exemplifies the polysilanes defined in the present invention, which have the repeating unit (1) and which are in the form of copolymers. To be more specific, polysilanes PSi-1 to PSi-24 are shown in Table A.

The present invention also provides a polysilane composition comprising a polysilane having a repeating unit (2) and a crosslinking agent. The polysilane having a repeating unit (2) is featured in that a phenolic hydroxyl group is introduced into at least one of the side chains of the polysilanes. Table B exemplifies the polysilane having a repeating unit (2). To be more specific, polysilanes PSi-25 to PSi-32 are shown in Table B.

In the polysilane composition of the present invention, the crosslinking agent serves to achieve crosslinking of polysilane molecules having a repeating unit (2) so as to form a polysilane having a two or three dimensional molecular structure. In the present invention, it is possible to use as the crosslinking agent a polyfunctional compound capable of reaction with the phenolic hydroxyl group in the polysilane having a repeating unit (2) or an electrophilic agent capable of an electrophilic reaction with the phenol nucleus included in the polysilane having a repeating unit (2).

The polyfunctional compounds capable of reaction with the phenolic hydroxyl group include, for example, a polyfunctional epoxy resin, a polyfunctional isocyanate compound and a polyfunctional acid anhydride. Specifically, it is possible to use the polyfunctional compounds described in, for example, "New Epoxy Resin" compiled by H. Kakiuchi and published by Shokodo Ltd. To be more specific, it is possible to use cycloaliphatic epoxide resins described on page 51 of the literature noted above, glycidylester series resins described on pages 59 to 61 of the literature, glycidylamine series resins described on pages 74 to 76 of the literature, heterocyclicepoxide resins (hydantoin type epoxy resins) described on page 87 of the literature, triglycidyl isocyanurates described on page 91 of the literature, special epoxy resins described on pages 97 to 98 of the literature, isocyanate compounds described on page 153 of the literature, aromatic acid anhydrides described on pages 192 to 202 of the literature, etc.

The polyfunctional compounds exemplified above carry out a reaction with the phenolic hydroxyl group in the side chain of the polysilane having a repeating unit (2) so as to achieve crosslinking of the polysilane molecules. As a result, formed is a cured material of a polysilane having a two or three dimensional molecular structure. In some cases, the polyfunctional compound involved in the crosslinking reaction has an atomic group similar to the reactive group introduced into the side chain of the polysilane having a repeating unit (1), i.e., the reactive group which performs a crosslinking reaction upon light exposure or by heating. In other words, it is considered reasonable to understand that a reactive group similar to the reactive group introduced into the side chain of the polysilane having a repeating unit (1) is contained in the polyfunctional compound used as the crosslinking agent in the polysilane composition comprising the polysilane having a repeating unit (2). Particularly, the polysilane molecules having a repeating unit (1) in which $R^2$ represents an arylene group can be crosslinked so as to provide a satisfactory cured material of a polysilane. Likewise, a crosslinking reaction can be carried out in a polysilane composition comprising a polysilane having a repeating unit (2) and the particular polyfunctional compound as a crosslinking agent so as to provide a satisfactory cured material of a polysilane. It is supposed that these cured materials each comprise polysilanes having the same two or three dimensional molecular structures.

As described previously, an electrophilic agent capable of an electrophilic reaction with the phenol nucleus of the polysilane having a repeating unit (2) can also be used as the crosslinking agent in the composition of the present invention comprising the polysilane having a repeating unit (2) and the crosslinking agent. The electrophilic agents used in the present invention include, for example, aldehyde compounds, and methylol compound having at least two functional groups such as =N—CH$_2$—OH in the molecule. The aldehyde compounds used in the present invention include, for example, formaldehyde, acetoaldehyde, propionaldehyde, and butyraldehyde. On the other hand, the methylol compounds used in the present invention include, for example, the compound of the chemical structure given below:

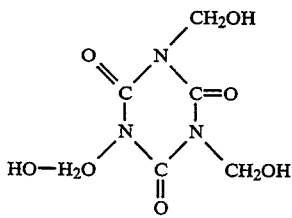

A reaction between the electrophilic agent and the polysilane having a repeating unit (2) can be carried out by a method described in, for example, "Lectures on New Experimental Chemistry, Vol. 19, pages 299 to 304" so as to achieve crosslinking of the Si—Si backbones of the polysilane and to form a cured material of a polysilane having a two or three dimensional molecular structure. To be more specific, a composition comprising a polysllane having a repeating unit (2) and an electrophilic agent is dissolved in a solvent, and the resultant solution is subjected to a reflux treatment, together with a catalyst, under heating for a predetermined period of time. Then, water in the reaction system is removed by means of distillation under a reduced pressure so as to obtain a cured material of a having a two or three dimensional molecular structure.

In the reaction described above, the electrophilic agent is electrophilically bonded to the ortho or para position of the phenol nucleus relative to the phenolic hydroxyl group, i.e., the phenol nucleus introduced into the side chain of the polysilane having a repeating unit (2), so as to achieve crosslinking of polysilane molecules. In the case of using, for example, formaldehyde as the electrophilic agent, the carbonium cation of the formaldehyde is bonded to the ortho or para position of the phenol nucleus relative to the hydroxyl group so as to form methylol. The methylol thus formed is converted into an active intermediate of benzyl cation and, then, forms a methylene linkage between the phenol nuclei in the different polysilane molecules, so as to achieve crosslinking of polysilane molecules.

In the polysilane composition of the present invention, it is desirable to use the crosslinking agent, i.e., the polyfunctional compound or the electrophilic agent described above, in an amount of 0.01 to 2 equivalents based on the amount of the phenol nucleus of the polysilane having a repeating unit (2). If the amount of the crosslinking agent is smaller than 0.01 equivalent, it is impossible to obtain a sufficient crosslinking effect. If the amount noted above exceeds 2 equivalents, however, the cured material of a polysilane formed after the crosslinking reaction fails to exhibit satisfactory properties.

It is possible to dissolve the polysilane or the polysilane composition defined in the present invention in an organic solvent, followed by forming a polysilane thin film on a substrate by using the resultant solution and subsequently curing the polysilane thin film. In practice, a polysilane having a repeating unit (1) or a polysilane composition comprising a polysilane having a repeating unit (2) and a crosslinking agent is dissolved in a suitable solvent together with, for example, a catalyst, if necessary. Then, the surface of a suitable substrate is coated with the resultant solution by means of, for example, a rotary coating method, followed by evaporating the solvent so as to form a polysilane thin film on the substrate. Finally, a treatment such as light exposure or heating is applied to the thin film. In this step, the crosslinking reaction between polysilane molecules is carried out by the reactive group in the side chain, when it comes to a polysilane having a repeating unit (1), so as to obtain a cured polysilane thin film having a two or three dimensional molecular structure. When it comes to a polysilane having a repeating unit (2), the crosslinking agent crosslinks the polysilane molecules so as to obtain a cured polysilane thin film in which the polysilane has a two or three dimensional molecular structure.

Where the polysilane has a low crosslinking density, the cured material thereof is soluble in an organic solvent. Therefore, it is possible to carry out a crosslinking reaction of polysilane molecules within, for example, an organic solvent so as to form a polysilane having a two or three dimensional molecular structure, followed by forming a thin film of the polysilane having a two or three dimensional molecular structure on the surface of a substrate by an ordinary process of forming a thin film. Alternatively, it is possible to partially crosslink the polysilane molecules within an organic solvent so as to form a partially cured (crosslinked) polysilane, followed by coating a substrate with the solution containing the partially cured polysilane. In this case, a crosslinking reaction is further carried out within the coating so as to obtain a cured thin film formed of a crosslinked polysilane having a two or three dimensional molecular structure.

Further, it is possible to employ an LB (Langmuir-Blodgett) technique for forming a polysilane thin film on a substrate. In this case, used is an organic solution prepared by dissolving a polysilane having a repeating unit (1), or a polysilane composition comprising a polysilane having a repeating unit (2) and a crosslinking agent, in an organic solvent.

To be more specific, a polysilane having a repeating unit (1), or a polysilane composition comprising a polysilane having a repeating unit (2) and a crosslinking agent, is dissolved in an organic solvent. Then, the resultant solution is dripped onto the surface of a liquid material such as a water surface. In this case, the polysilane molecules are oriented on the liquid surface such that the hydrophilic group on the side of, for example, the group X in the polysilane having a repeating unit (1), or the groups $R^5$ to $R^9$ in the polysilane having a repeating unit (2), is in direct contact with the liquid surface, and the hydrophobic group on the side of $R^1$ the polysilane having a repeating unit (1), or the group $R^3$ in the polysilane having a repeating unit (2) is positioned away from the water surface. It follows that the polysilane dripped onto the liquid surface form a stable monomolecular film.

In the next step, the monomolecular films thus formed are compressed to have a predetermined surface pressure. Under this condition, a substrate having, for example, a hydrophobic treatment applied thereto in advance is dipped into the liquid in a direction perpendicular to the monomolecular film surface, while controlling the area of the monomolecular film such that the surface pressure of the film is maintained constant, followed by pulling up the substrate from the liquid. It should be noted that the monomolecular film formed on the liquid surface is transferred onto the substrate in the step of dipping the substrate and/or pulling up the substrate, making it possible to form a polysilane thin film. It is also possible to form a polysilane built-up film on a substrate by repeatedly carrying out several times the dipping and pulling operations of the substrate. The LB film forming operation described above can be performed by using an ordinary LB film-forming apparatus.

Partcularly, the polysilane and the composition of the present invention can be formed into a built-up film with an excellent regularity in the film thickness direction, by employing the LB technique. Further, where the polysllane comprising the repeating unit (1) has a side chain with specific carbon number, the polysilane can be formed into a polysilane bulit-up film in which the Si—Si backbones of the polysilane molecules are orderly oriented along the dipping (or pulling) direction of the substrate noted above, by employing the LB technique. Likewise, where the polysilane comprising the repeating unit (2) contained in the composition of the invention has a side chain with specific carbon number, the composition can be formed into a polysllane built-up film in which the Si—Si backbones of the polysilane molecules are orderly oriented along the dipping direction of the substrate, by employing the LB technique.

It is possible to obtain a cured polysilane thin film formed of polysilane molecules having a two or three dimensional molecular structure by applying a treatment such as light exposure or heating to the polysilane thin film or the built-up film without impairing the regularity. It should also be noted that a thin film (or a built-up film) comprising the polysilane or the composition of the present invention and another organic or inorganic thin film can be laminated in arbitrary order formed by the LB technique so as to form a thin film element.

The description given above covers the case where the polysilane having a repeating unit (1), or the polysilane composition comprising a polysilane having a repeating unit (2) and a crosslinking agent, which are defined in the present invention, is used for forming a a cured polysilane thin film. However, the polysilane and the polysilane composition of the present invention can be used for forming a cured material of various shapes, that is, a molded form, said cured material comprising a polysilane having a two or three dimensional molecular structure, by the ordinary molding process.

Described in the following are some Examples of the present invention. In the Examples which follow, symbols are used for denoting some compounds used therein. Table C shows the compounds denoted by symbols in the following Examples.

EXAMPLE 1

135 g of m-(i-propenyl) phenol and 160 g of t-butyldimethylsilyl chloride were dissolved in 500 g of a hydrated ether, followed by dripping 101 g of triethylamine into the resultant solution. The reaction system was subjected to a reflux operation for 3 hours, followed by removing the formed salt by means of filtation. On the other hand, the filtrate was concentrated and distilled so as to obtain compound G-1. Further, a reaction among 248 g of the compound G-1 thus obtained, 157 g of compound S-1 and 5 g of chloroplatinic acid was carried out at 150° C. for 3 hours, followed by distilling the reaction mixture so as to obtain compound M-1.

In the next step, 5.0 g of metallic sodium was dispersed in 100 ml of toluene, followed by dripping a solution prepared by dissolving 40.5 g of the compound M-1 in 100 ml of toluene at 65° C. into the resultant dispersion. Under this condition, a reaction was carried out for 4 hours so as to polymerize the compound M-1. After completion of the reaction, insoluble matters such as the unreacted sodium and sodium chloride were removed by means of filtration, and the filtrate was concentrated under reduced pressure. The concentrate thus obtained was poured into methanol so as to refine the polymer.

10 g of the polymer thus obtained was dissolved in 500 ml of THF (tetrahydrofuran), followed by adding 54 cc of a 1M THF solution of n-$(C_4H_9)_4NF$ to the resultant solution so as to carry out a reaction at room temperature for 10 minutes. As a result, the t-butyldimethylsilyl group was decomposed. The reaction mixture was then washed with a dilute aqueous solution of hydrochloric acid, and the separated THF layer was concentrated. Further, the reaction product was dripped into toluene so as to obtain a polysilane having a repeating unit P-1, said polysilane having an average molecular weight of 120,000.

In the next step, 2.32 g of the polysilane having a repeating unit P-1 was dissolved in 100 ml of THF, followed by dripping a solution prepared by dissolving 0.1 g of triethylamine and 0.09 g of compound F-1 in 100 ml of THF into the resultant solution at room temperature. After completion of the dripping, the polymer was sufficiently washed with water so as to obtain polysilane PC-1 having the repeating unit (1) defined in the present invention.

2 g of the refined polysilane PC-1 and 0.01 g of benzophenone acting as a catalyst were dissolved in 10 ml of ethyl cellosolve acetate, followed by coating a silicon wafer with the resultant solution with a spinner so as to form a thin film having a thickness of 2.0 $\mu$m. The thin film was then exposed to light with an exposure of 10 mJ/cm$^2$ so as to cause reaction of the acryloy (acryl) groups in the side chains of the polysilane without breaking the Si—Si backbones, with the result that obtained was a cured thin film of the polysilane having a three dimensional molecular structure.

The cured polysilane thin film thus formed on the wafer was subjected to an adhesion test by a so-called "checker's test", in which the thin film on the substrate is partitioned into 100, i.e., 10×10, square sections each having a predetermined area, and a cellophane tape attached to the thin film is peeled with a predetermined force. Peeling was not found at all in this adhesion test, supporting a high adhesion strength between the cured polysilane thin film and the substrate.

On the other hand, 30 mg of the polysilane PC-1 was dissolved in one liter of cyclohexanone, followed by spreading the resultant solution on the surface of water so as to form a monomolecular film. Then, a silicon wafer was dipped into the water in a direction perpendicular to the water surface (or the surface of the monomolecular film), followed by pulling the silicon wafer out of the water. The dipping/pulling operations were carried out repeatedly so as to form a polysilane thin film (or an LB built-up film) in which 12 layers of the monomolecular films of the polysilane PC-1 were built up on the silicon wafer substrate.

In the polysilane thin film thus formed on the substrate by the LB technique, the absorption of polarized UV having a wavelength of 335 nm and also having a moment in the pulling direction of the substrate, i.e., the pulling direction of the thin film, was found to be greater than the absorption of the polarized UV having a moment in a direction perpendicular to the pulling direction of the substrate. This suggests that, in the polysilane thin film thus formed, the Si—Si backbones of the polysilane molecules are oriented along the pulling direction of the substrate employed in the LB technique.

On the other hand, the polysilane thin film formed on the substrate by the LB technique was exposed to UV light using a high pressure mercury lamp as a light source at an exposure of 10 mJ/cm$^2$ so as to crosslink the polysilane molecules and, thus, to obtain a cured thin film in which the polysilane molecules constructed a three dimensional molecular structure. In the cured polysilane thin film thus formed on the substrate, the absorption of polarized UV having a wavelength of 335 nm and also having a moment in the pulling direction of the substrate was found to be greater than the absorption of the polarized UV having a moment in a direction perpendicular to the pulling direction of the substrate. This suggests that, in the cured polysilane thin film thus formed, the Si—Si backbones of the crosslinked polysilane molecules having a three dimensional molecular structure are also oriented along the pulling direction of the substrate employed in the LB technique.

EXAMPLE 2

2.32 g of the polysilane having a repeating unit P-1, which was synthesized in Example 1, was dissolved in 100 ml of THF, followed by dripping a solution prepared by dissolving 0.2 g of triethylamine and 0.02 g of compound F-2 in 100 ml of THF into the resultant solution at room temperature. After the dripping, the polymer was sufficiently washed with water so as to obtain polysilane PC-2 having the repeating unit (1) defined in the present invention.

In the next step, 2 g of the refined polysilane PC-2 and 0.01 g of benzophenone acting as a catalyst were dissolved in 10 ml of ethyl cellosolve acetate, followed by coating the surface of a silicon wafer with the resultant solution by using a spinner so as to form a thin film having a thickness of 2.0 $\mu$m. Then, the thin film was exposed to light at an exposure of 20 mJ/cm$^2$ so as to allow the methacryloyl groups or methacryl groups in the side chains of the polysllanes to carry out a reaction without breaking the Si—Si backbones of the polysilane molecules. As a result, obtained was a cured thin film of the polysilane having a three dimensional molecular structure.

The cured polysilane thin film thus formed on the wafer was subjected to an adhesion test by the checker's test, as in Example 1. Peeling was not found at all in this adhesion test, supporting a high adhesion strength between the cured polysilane thin film and the substrate. For comparison, a similar adhesion test was applied to the polysilane thin film before the light exposure, with the result that all the partitioned sections of the polysilane thin film were peeled from the substrate.

On the other hand, 30 mg of the polysilane PC-2 and 0.5 mg of thioxanthone was dissolved in one liter of cyclohexanone, followed by spreading the resultant solution on the surface of water so as to form a monomolecular film. Then, a polysilane thin film (or an LB built-up film), in which 15 layers of the monomolecular films of the polysilane PC-2 were built up, was formed on a silicon wafer substrate, as in Example 1. The surface of the polysilane thin film was observed with SEM. The surface of the polysilane thin film was found to be free of defects and to be substantially uniform.

In the polysilane thin film thus formed on the substrate by the LB technique, the absorption of polarized UV having a wavelength of 335 nm and also having a moment in the pulling direction of the substrate was found to be greater than the absorption of the polarized UV having a moment in a direction perpendicular to the pulling direction of the substrate. This suggests that, in the polysilane thin film thus formed, the Si—Si backbones of the polysilane molecules are oriented along the pulling direction of the substrate employed in the LB technique.

On the other hand, the polysilane thin film formed on the substrate by the LB technique was exposed to UV light using a high pressure mercury lamp as a light source at an exposure of 10 mJ/cm$^2$ so as to crosslink the polysilane molecules and, thus, to obtain a cured thin film in which the polysilane molecules constructed a three dimensional molecular structure. In the cured polysilane thin film thus formed on the substrate, the absorption of polarized UV having a wavelength of 335 nm and also having a moment in the pulling direction of the substrate was found to be greater than the absorption of the UV having a moment in a direction perpendicular to the pulling direction of the substrate. This suggests that, in the cured polysilane thin film thus formed, the Si—Si backbones of the crosslinked polysilane molecules having a three dimensional molecular structure are also oriented along the pulling direction of the substrate employed in the LB technique.

EXAMPLE 3

171 g of m-bromophenol G-2 and 160 g of t-butyldimethylsilyl chloride were dissolved in 500 g of an anhydrons ether, followed by dripping 101 g of triethylamine into the resultant solution. The reaction system was subjected to a reflux operation for 3 hours, followed by removing the formed salt by means of filtration. On the other hand, the filtrate was distilled and concentrated so as to obtain compound G-3. Further, a Grignard reagent synthesized from 285 g of the compound G-3 and 24 g of Mg was dripped into 220 g of compound S-2. After the dripping, the reaction system was subjected to a reflux operation for 4 hours. Then, the formed salt was removed by means of filtration. On the other hand, the filtrate was concentrated and the concentrate was distilled under reduced pressure so as to obtain compound M-2.

In the next step, 5.0 g of metallic sodium was dispersed in 100 ml of toluene, followed by dripping a solution prepared by dissolving 39.0 g of the compound M-2 in 100 ml of toluene at 65° C. into the resultant 10 dispersion. Under this condition, a reaction was carried out for 4 hours so as to polymerize the compound M-2. After completion of the reaction, insoluble matters such as the unreacted sodium and sodium chloride were removed by means of filtration, and the filtrate was concentrated under reduced pressure. The concentrate thus obtained was poured into methanol so as to refine the formed polymer.

10 g of the polymer thus obtained was dissolved in 500 ml of THF, followed by adding 55 cc of a 1M THF solution of n-$(C_4H_9)_4$NF to the resultant solution so as to carry out a reaction at room temperature for 10 minutes. As a result, the t-butyldimethylsilyl group was decomposed. The reaction mixture was then washed with a dilute aqueous solution of hydrochloric acid, and the separated THF layer was concentrated. Further, the reaction product was dripped into toluene so as to obtain a polysilane having a repeating unit P-2, said polysilane having an average molecular weight of 150,000.

In the next step, 2.32 g of the polysllane having a repeating unit P-2 was dissolved in 100 ml of THF, followed by dripping a solution prepared by dissolving 0.1 g of triethylamine and 0.17 g of compound F-3 in 100 ml of THF into the resultant solution at room temperature. After completion of the dripping, the polymer was sufficiently washed with water so as to obtain polysilane PC-3 having the repeating unit (1) defined in the present invention.

2 g of the refined polysilane PC-3 was dissolved in 10 ml of ethyl cellosolve acetate, followed by coating a silicon wafer with the resultant solution with a spinner so as to form a thin film having a thickness of 2.0 μm. The thin film was then exposed to light with an exposure of 20 mJ/cm$^2$ so as to cause reaction of the cinnamoyl groups in the side chains of the polysilane without breaking the Si—Si backbones, with the result that obtained was a cured thin film of the polysilane having a three dimensional molecular structure.

The cured polysilane thin film thus formed on the wafer was subjected to an adhesion test by the checker's test as in Example 1. Peeling of the test piece, i.e., partitioned polysilane sections, was not found at all in this adhesion test, supporting a high adhesion strength between the cured polysilane thin film and the substrate. Also, the cured polysilane film was found to be uniform and not to peel off even if wiped with acetone. Further, no scratch was found when the cured polysilane film was scraped with a pencil having a hardness F. For comparison, the polysilane thin films before the light exposure were scraped with pencils of various hardnesses, with the result that the film was scratched when scraped with a pencil having a hardness 5B. This supports that the polysilane thin film before curing is not satisfactory in mechanical strength.

On the other hand, 30 mg of the polysilane PC-3 was dissolved in one liter of cyclohexanone, followed by spreading the resultant solution on the surface of water so as to form a monomolecular film. Then, a polysilane thin film (or an LB built-up film) in which a plurality of the monomolecular films of the polysilane PC-3 were built up, was formed on the silicon wafer substrate, as in Example 1, said thin film having a thickness of 2000 Å.

The surface of the polysilane thin film formed on the substrate by the LB method was observed with SEM. The thin film was found to be free of defects and to be substantially uniform.

In the polysilane thin film thus formed on the substrate by the LB technique, the absorption of polarized UV having a wavelength of 340 nm and also having a moment in the pulling direction of the substrate, i.e., was found to be greater than the absorption of the polarized UV having a moment in a direction perpendicular to the pulling direction of the substrate. This suggests that, in the polysilane thin film thus formed, the Si—Si backbones of the polysilane molecules are oriented along the pulling direction of the substrate employed in the LB technique.

On the other hand, the polysilane thin film formed on the substrate by the LB technique was exposed to UV light using a high pressure mercury lamp as a light source at an exposure of 10 mJ/cm$^2$ so as to crosslink the polysilane molecules and, thus, to obtain a cured thin film in which the polysilane molecules constructed a three dimensional molecular structure. In the cured polysilane thin film thus formed on the substrate, the absorption of polarized UV having a wavelength of 340 nm and also having a moment in the pulling direction of the substrate was found to be greater than the absorption of the polarized UV having a moment in a direction perpendicular to the pulling direction of the substrate. This suggests that, in the cured polysilane thin film thus formed, the Si—Si backbones of the crosslinked polysilane molecules having a three dimensional molecular structure are also oriented along the pulling direction of the substrate employed in the LB technique.

Further, a three dimensional non-linear susceptibility of the cured polysilane thin film was measured, obtaining a value of $2 \times 10^{-11}$ esu in the pulling direction of the substrate in the LB technique and a value of $5 \times 10^{-13}$ esu in a direction perpendicular to the pulling direction of the substrate. In other words, it has been confirmed that the cured polysilane thin film exhibits an antsotropy in the non-linear optical characteristics.

EXAMPLE 4

A Grignard reagent synthesized from 285 g of the compound G-3 obtained in Example 3 and 24 g of Mg within an ether was dripped into 192 g of compound S-3. After the dripping, the system was subjected to a reflux operation for 4 hours. The formed salt was removed by means of filtration. On the other hand, the filtrate was concentrated, and the concentrate was distilled under reduced pressure so as to obtain compound M-3.

In the next step, 5.0 g of metallic sodium was dispersed in 100 ml of toluene, followed by adding 36.0 g of the compound M-3 into the resultant dispersion. Under this condition, a reaction was carried out for 4 hours so as to polymerize the compound M-3. After completion of the reaction, insoluble matters such as the unreacted sodium and sodium chloride were removed by means of filtration, and the filtrate was concentrated under reduced pressure. The concentrate thus obtained was poured into methanol so as to refine the formed polymer.

One gram of the polymer thus obtained was dissolved in 200 ml of THF, followed by adding 5 cc of a 1M THF solution of n-$(C_4H_9)_4$NF to the resultant solution so as to carry out a reaction at room temperature for 10 minutes. As a result, the t-butyldimethyl silyl group was decomposed. The reaction mixture was then washed with a dilute aqueous solution of hydrochloric acid so as to obtain a polysilane having a repeating unit (P-3), said polysilane having an average molecular weight of 250,000.

In the next step, 2.32 g of the polysilane having a repeating unit P-3 was dissolved in 100 ml of THF, followed by dripping a solution prepared by dissolving 0.1 g of triethylamine and 0.16 g of compound F-4 in 100 ml of THF into the resultant solution at room temperature. After completion of the dripping, the polymer was sufficiently washed with water so as to obtain polysilane PC-4 having the repeating unit (1) defined in the present invention.

2 g of the refined polysilane PC-4 and 0.01 g of compound PH-1 acting as a catalyst were dissolved 10 ml of ethyl cellosolve acetate, followed by coating a silicon wafer with the resultant solution with a spinner so as to form a thin film having a thickness of 2.0 $\mu$m. The thin film was then exposed to light at an exposure rate of 20 mJ/cm$^2$ so as to cause reaction of the epoxy groups in the side chains of the polysilane without breaking the Si—Si backbones, with the result that obtained was a cured thin film of the polysllane having a three dimensional molecular structure.

The cured polysilane thin film thus formed on the wafer was subjected to an adhesion test by the checker's test, as in Example 1. Peeling was not found at all in this adhesion test, supporting a high adhesion strength between the cured polysilane thin film and the substrate. Further, the cured polysilane thin film was scraped with a pencil having a hardness F. No scratch was found in the cured polysilane thin film. For comparison, the polysilane thin film before the light exposure was scraped with pencils having various hardnesses. It was found that the polysilane thin film was scratched when scraped with a pencil having a hardness 5B, clearly supporting that the polysilane thin film before light exposure is low in mechanical strength.

EXAMPLE 5

171 g of p-bromophenol and 160 g of t-butyldimethylsilyl chloride were dissolved in 500 g of an anhydrous ether, followed by dripping 101 g of triethylamine into the resultant solution. The reaction system was subjected to a reflux operation for 3 hours, followed by removing the formed salt by means of filtration. On the other hand, the filtrate was concentrated and distilled so as to obtain compound G-4. Further, a Grignard reagent within an ether, which was synthesized from 285 g of the compound G-4 and 24 g of Mg, was dripped into 381 g of compound S-4. After the dripping, the system was subjected to a reflux operation for 4 hours. Then, the formed salt was removed by means of filtration. On the other hand, the filtrate was concentrated and the concentrate was distilled under reduced pressure so as to obtain compound M-4.

In the next step, 5.0 g of metallic sodium was dispersed in 100 ml of toluene, followed by dripping a solution prepared by dissolving 39.0 g of the compound M-4 in 100 ml of toluene at 65° C. into the resultant dispersion. Under this condition, a reaction was carried out for 4 hours so as to polymerize the compound M-4. After completion of the reaction, insoluble matters such as the unreacted sodium and sodium chloride were removed by means of filtration, and the filtrate was concentrated under reduced pressure. The concentrate thus obtained was poured into methanol so as to refine the formed polymer.

10 g of the polymer thus obtained was dissolved in 500 ml of THF, followed by adding 54 cc of a 1M THF solution of n-$(C_4H_9)_4$NF to the resultant solution so as to carry out a reaction at room temperature for 10 minutes. As a result, the t-butyldimethylsilyl group was decomposed. The reaction mixture was then washed with a dilute aqueous solution of hydrochloric acid, and the separated THF layer was concentrated. Further, the reaction product was dripped into toluene so as to obtain a polysilane having a repeating unit P-4, said polysilane having an average molecular weight of 150,000.

In the next step, 3.79 g of the polysilane having a repeating unit P-4 was dissolved in 100 ml of THF, followed by dripping a solution prepared by dissolving 0.2 g of triethylamine and 0.2 g of compound F-2 in 100 ml of THF into the resultant solution at room temperature. After completion of the dripping, the polymer was sufficiently washed with water so as to obtain polysilane PC-5 having the repeating unit (1) defined in the present invention.

30 mg of the polysilane PC-5 and 0.1 mg of benzoin ethyl ethel acting as a catalyst was dissolved in one liter of cyclohexanone, followed by spreading the resultant solution on the surface of water so as to form a monomolecular film. Then, a polysilane thin film (or an LB thin film), in which a plurality of the monomolecular films of the polysilane PC-5 were built up, was formed on silicon wafer substrate, as in Example 1, said thin film having a thickness of 200 Å.

The surface of the polysilane thin film thus formed on the substrate by the LB technique was observed with SEM. The thin film was found to be free of defects and to be substantially uniform.

The polystlane thin film thus formed on the substrate by the LB technique was exposed to UV light emitted from a high pressure mercury lamp with an exposure of 10 mJ/cm$^2$ so as to crosslink the polysilane molecules and, thus, to obtain a cured polysilane thin film in which the polysilane has a three dimensional molecular structure. In the cured polysilane thin film, the absorption of polarized Uv having a wavelength of 303 run and also having a moment in the pulling direction of the substrate was found to be greater than the absorption of the polarized Uv having a moment in a direction perpendicular to the pulling direction of the substrate. This suggests that, in the polysilane thin film thus formed, the Si—Si backbones of the polysilane molecules are oriented along the pulling direction of the substrate employed in the LB technique.

Further, a three dimensional non-linear susceptibility of the cured polysilane thin film was measured, obtaining a value of $2 \times 10^{-11}$ esu in the pulling direction of the substrate in the LB technique and a value of $5 \times 10^{-13}$ esu in a direction perpendicular to the pulling direction of the substrate. This supports that the cured polysilane thin film exhibits an anisotropy in the non-linear optical characteristics.

Still further, a liquid crystal material was sealed in a space between the two cured polysilane thin films disposed to face each other. It has been confirmed that the liquid crystal molecules are oriented in the direction of orientation of the polysilane molecules. This supports that the polysilane of the present invention can be used satisfactorily as a liquid crystal orientating film.

EXAMPLE 6

181 g of 6-bromo 1-hexanol and 160 g of t-butyldimethylsilyl chloride were dissolved in 500 g of an anhydrous ether, followed by dripping 101 g of triethylamine into the resultant solution. The reaction system was subjected to a reflux operation for 3 hours, followed by removing the formed salt by means of filtration. On the other hand, the filtrate was concentrated and distilled so as to obtain compound G-5. Further, a Grignard reagent synthesized from 295 g of the compound G-5 and 24 g of Mg within an ether was dripped into 220 g of compound S-2. After the dripping, the reaction system was subjected to a reflux operation for 4 hours. Then, the formed salt was removed by means of filtration. On the other hand, the filtrate was concentrated and the concentrate was distilled under reduced pressure so as to obtain compound M-5.

In the next step, 5.0 g of metallic sodium was dispersed in 100 ml of toluene, followed by dripping a solution prepared by dissolving 28.6 g of the compound M-5 in 100 ml of toluene at 65° C. into the resultant dispersion. Under this condition, a reaction was carried out for 4 hours so as to polymerize the compound M-5. After completion of the reaction, insoluble matters such as the unreacted sodium and sodium chloride were removed by means of filtration, and the filtrate was concentrated under reduced pressure. The concentrate was poured into methanol so as to refine the formed polymer.

10 g of the polymer thus obtained was dissolved in 500 ml of THF (tetrahydrofuran), followed by adding 54 cc of a 1M THF solution of n-($C_4H_9$)$_4$NF to the resultant solution so as to carry out a reaction at room temperature for 10 minutes. As a result, the t-butyldimethylsilyl group was decomposed. The reaction mixture was then washed with a dilute aqueous solution of hydrochloric acid, and the separated THF layer was concentrated. Further, the reaction product was dripped into toluene so as to obtain a polysilane having a repeating unit P-5, said polysilane having an average molecular weight of 12,000.

In the next step, 1.13 g of the polysilane having a repeating unit P-5 was dissolved in 100 ml of THF, followed by dripping a solution prepared by dissolving 0.2 g of triethylamine and 0.2 g of compound F-2 in 100 ml of THF into the resultant solution at room temperature. After completion of the dripping, the polymer was sufficiently washed with water so as to obtain polysilane PC-6 having the repeating unit (1) defined in the present invention.

On the other hand, 30 mg of the polysilane PC-6 and 0.1 mg of benzoin ethyl ether acting as a catalyst were dissolved in one liter of cyclohexanone, followed by spreading the resultant solution on the surface of water so as to form a monomolecular film. Then, a polysilane film (or an LB built-up film) in which a plurality of the monomolecular films of the polysilane PC-6 were built up, was formed on a silicon wafer substrate by an LB technique as in Example 1, said thin film having a thickness of 150 Å.

The surface of the polysilane thin film thus formed on the substrate by the LB technique was observed with SEM. The thin film was found to be free of defects and to be substantially uniform.

On the other hand, the polysilane thin film formed on the substrate by the LB technique was exposed to UV light using a high pressure mercury lamp as a light source at an exposure of 10 mJ/cm$^2$ so as to crosslink the polysilane molecules and, thus, to obtain a cured thin film in which the polysilane molecules constructed a three dimensional molecular structure. In the cured polysllane thin film thus formed on the substrate, the absorption of polarized UV having a wavelength of 335 nm and also having a moment in the pulling direction of the substrate was found to be greater than the absorption of the polarized UV having a moment in a direction perpendicular to the pulling direction of the substrate. This suggests that, in the cured polysilane thin film, the Si—Si backbones of the crosslinked polysilane molecules are oriented along the pulling direction of the substrate employed in the LB technique.

Further, a liquid crystal material was sealed in a space between two cured polysilane thin films disposed to face each other. It has been confirmed that the liquid crystal molecules are oriented along the direction of orientation of the polysilane molecules. This supports that the polysilane of the present invention can be used satisfactorily as a liquid crystal orientating film.

EXAMPLE 7

3.5 g of metallic sodium was dispersed in 100 ml of toluene, followed by dripping a solution prepared by dissolving 32.1 g of compound M-6 in 100 ml of toluene at 100° C. into the resultant dispersion. Under this condition, a reaction was carried out at 110° C. for 1 hour. After completion of the reaction, insoluble matters such as the unreacted sodium and sodium chloride were removed by means of filtration, and the filtrate was concentrated under reduced pressure. 200 ml of methanol was added to the concentrate thus obtained, and the resultant system was stirred for one hour. Then, the insoluble materials were removed by means of filtration. Next, the filtrate was concentrated under reduced pressure and, then, poured into toluene. The operation described above was repeated twice in an attempt to refine the formed product. As a result, obtained was a polysilane having a repeating unit P-6, which corresponds to the repeating unit (2) defined in the present invention, i.e., the polysilane contained in the polysilane composition defined in the present invention. The average molecular weight of the polysilane thus formed was found to be 200,000.

2.4 g of the polymer having a repeating unit P-6 was dissolved in 50 ml of methanol, followed by adding 0.5 g of barium hydroxide acting as a catalyst and 12 g of formalin, i.e., an aqueous solution containing 37% by weight of formaldehyde, acting as a crosslinking agent to the resultant solution so as to carry out a reaction at room temperature for 2 hours. After the reaction, the formed product was refined by allowing the formed product to precipitate in water. One gram of the refined product was dissolved in 5 ml of acetate cellosolve, followed by coating a silicon wafer with the resultant solution by a spinner so as to form a thin film having a thickness of 1.5 μm. Further, the thin film thus formed was baked at 150° C. for 10 minutes so as to achieve crosslinking of the polysilane molecules and, thus, to obtain a cured polysilane thin film in which the polysilane molecules constructed a three dimensional molecular structure.

The cured polysilane thin film was found not to be insoluble in an organic solvent such as acetone or tetrahydrofuran (THF), indicating that the polysilane molecules forming the thin film were sufficiently crosslinked. Further, the cured polysilane thin film thus formed on the wafer was subjected to an adhesion test by the checker's test, as in Example 1. Peeling was not found at all in this adhesion test, supporting a high adhesion strength between the cured polysilane thin film and the substrate. Still further, the glass transition temperature Tg of the cured polysilane thin film was found to be as high as about 120° C., supporting that the cured polysilane thin film exhibits a sufficiently high heat resistance.

For comparison, a thin film of polysilane having a repeating unit P-6, which was not subjected to a baking treatment, i.e., without crosslinking of the polysilane moleculaes, was similarly subjected to an adhesion test as above. All the partitioned small sections of the polysilane film were found to be peeled from the substrate, indicating that the adhesion strength between the polysilane film and the substrate was low.

EXAMPLE 8

One gram of the polymer having a repeating unit P-6, which was synthesized in Example 7, and 0.3 g of methylol compound N-1 were dissolved in 5 ml of acetate cellosolve, followed by coating a silicon wafer with the resultant solution by a spinner so as to form a thin film having a thickness of 0.7 μm. Further, the thin film thus formed was baked at 120° C. for 10 minutes so as to achieve crosslinking of the polysilane molecules and, thus, to obtain a cured polysilane thin film in which the polysilane molecules constructed a three dimensional molecular structure.

The cured polysilane thin film was found to be insoluble in acetone, indicating that the polysilane molecules forming the thin film were sufficiently crosslinked. Further, the cured polysilane thin film thus formed on the wafer was subjected to an adhesion test by the checker's test, as in Example 1. Peeling was not found at all in this adhesion test, supporting a high adhesion strength between the cured polysilane thin film and the substrate. Still further, the glass transition temperature Tg of the cured polysilane thin film was found to be as high as about 130° C., supporting that the cured polysilane thin film exhibits a sufficiently high heat resistance.

EXAMPLE 9

3.5 of metallic sodium was dispersed in 100 ml of toluene, followed by dripping a solution prepared by dissolving 34 g of compound M-7 in 100 ml of toluene at 100° C. into the resultant dispersion. Under this condition, a reaction was carried out for one hour. After completion of the reaction, insoluble matters such as the unreacted sodium and sodium chloride were removed by means of filtration, and the filtrate was concentrated under reduced pressure. The concentrate thus obtained was refined with methanol, as in Example 7.

One gram of the polymer thus obtained was dissolved in 100 ml of THF, followed by adding 0.5 g of methane sulfonic acid and 2 g of water to the resultant solution so as to carry out a reaction at room temperature for one hour. As a result, formed was a polysilane having a repeating unit P-7, said polysilane corresponding to a polysilane having the repeating unit (2) defined in the present invention, i.e., the polysilane contained in the polysilane composition defined in the present invention. The average molecular weight of the formed polysilane having a repeating unit P-7 was found to be 9,000. The polysilane thus formed was refined by allowing the polysilane to precipitate in water.

One gram of the refined polysilane having a repeating unit P-7, 0.05 g of tris (acetylacetonato) aluminum acting as a catalyst, and epoxy resin E-1 acting as a crosslinking agent were dissolved in 5 ml of ethyl acetate cellosolve, followed by coating a silicon wafer with the resultant solution with a spinner so as to form a thin film having a thickness of 2.5 μm. The thin film was then baked at 100° C. for 5 minutes so as to crosslink the polysilane molecules and, thus, to obtain a cured thin film in which the polysilane molecules constructed a three dimensional molecular structure.

The cured polysilane thin film was found to be uniform and insoluble in acetone, indicating that the polysilane molecules forming the thin film were crosslinked sufficiently. Further, the cured polysilane thin film was scraped with a pencil having a hardness F. However, the cured thin film was not scratched at all, supporting that the cured thin film had a sufficient mechanical strength.

EXAMPLE 10

One gram of the polymer having a repeating unit P-7, which was synthesized in Example 9, and 0.3 g of an isocyanate compound acting as a crosslinking agent were dissolved in 5 ml of acetate cellosolve, followed by coating a silicon wafer with the resultant solution by a spinner so as to form a thin film having a thickness of one μm. Further, the thin film thus formed was baked at 100° C. for 5 minutes so as to achieve crosslinking of the polysilane molecules and, thus, to obtain a cured polysilane thin film in which the polysilane molecules constructed a three dimensional molecular structure.

The cured polysilane thin film was found to be uniform and insoluble in acetone, indicating that the polysilane molecules forming the thin film were sufficiently crosslinked. Further, the cured polysilane thin film was scraped with a pencil having a hardness F. However, the cured thin film was not scratched at all, supporting that cured the thin film had a sufficient mechanical strength.

For comparison, a thin film of the polysilane having a repeating unit P-7, which was not baked for the crosslinking of the polysilane molecules, was also scraped with pencils having various hardnesses. In this case, the thin film was scratched when scraped with a pencil having a hardness 5B, indicating that the polysilane thin film in which the molecules were not crosslinked is low in mechanical strength.

As described above in detail, the present invention provides a polysilane having a repeating unit (1) and a polysilane composition comprising a polysilane having a repeating unit (2) and a crosslinking agent. Each of these polysilane and the polysilane composition of the present invention exhibits a high affinity with an organic solvent, making it possible to form, for example, a thin film. Also, it is possible to form a cured polysilane thin film, in which the polysilane molecules constructs a three dimensional molecular structure, having a high adhesion strength with a substrate, a high mechanical strength and a high heat resistance. Further, it is possible to employ an LB technique for forming a polysilane thin film having excellent uniformity, regularity and anisotropy as well as excellent mechanical properties, etc. when cured by light exposure or heating. Particularly, a polysilane film having a thickness of 0.1 μm. or less can be formed easily by the LB technique. Naturally, each of the polysilane and the polysilane composition defined in the present invention can be used as, for example, a material of a charge-transfer layer included in an electronic photographic light sensitive material, a nonlinear optical material, an electically conductive material, an insulating material, a piezoelectric material, a pyroelectric material and a material of an orientating film in a liquid crystal display device. Of course, the present invention is of a large industrial value.

TABLE A

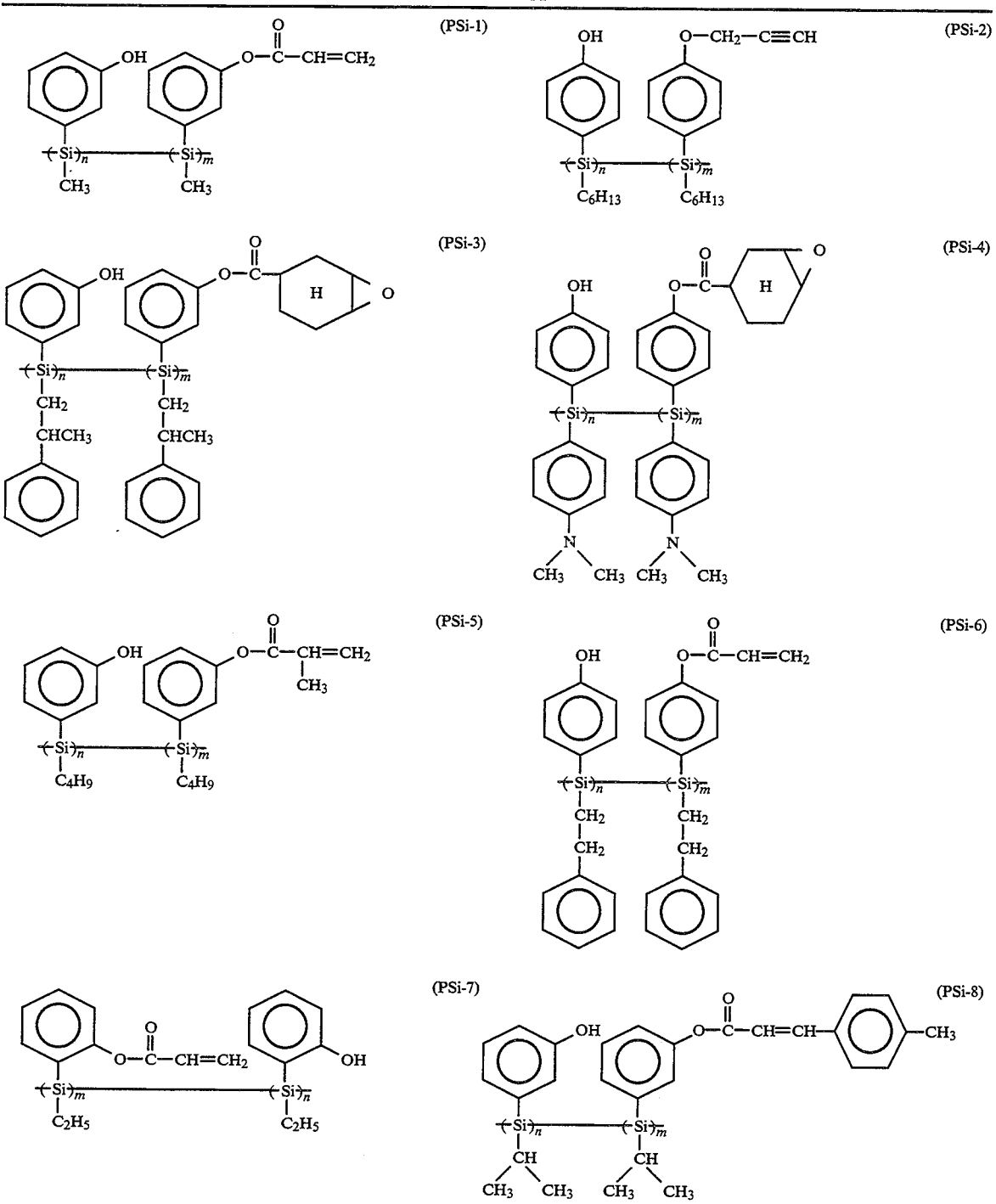

TABLE A-continued
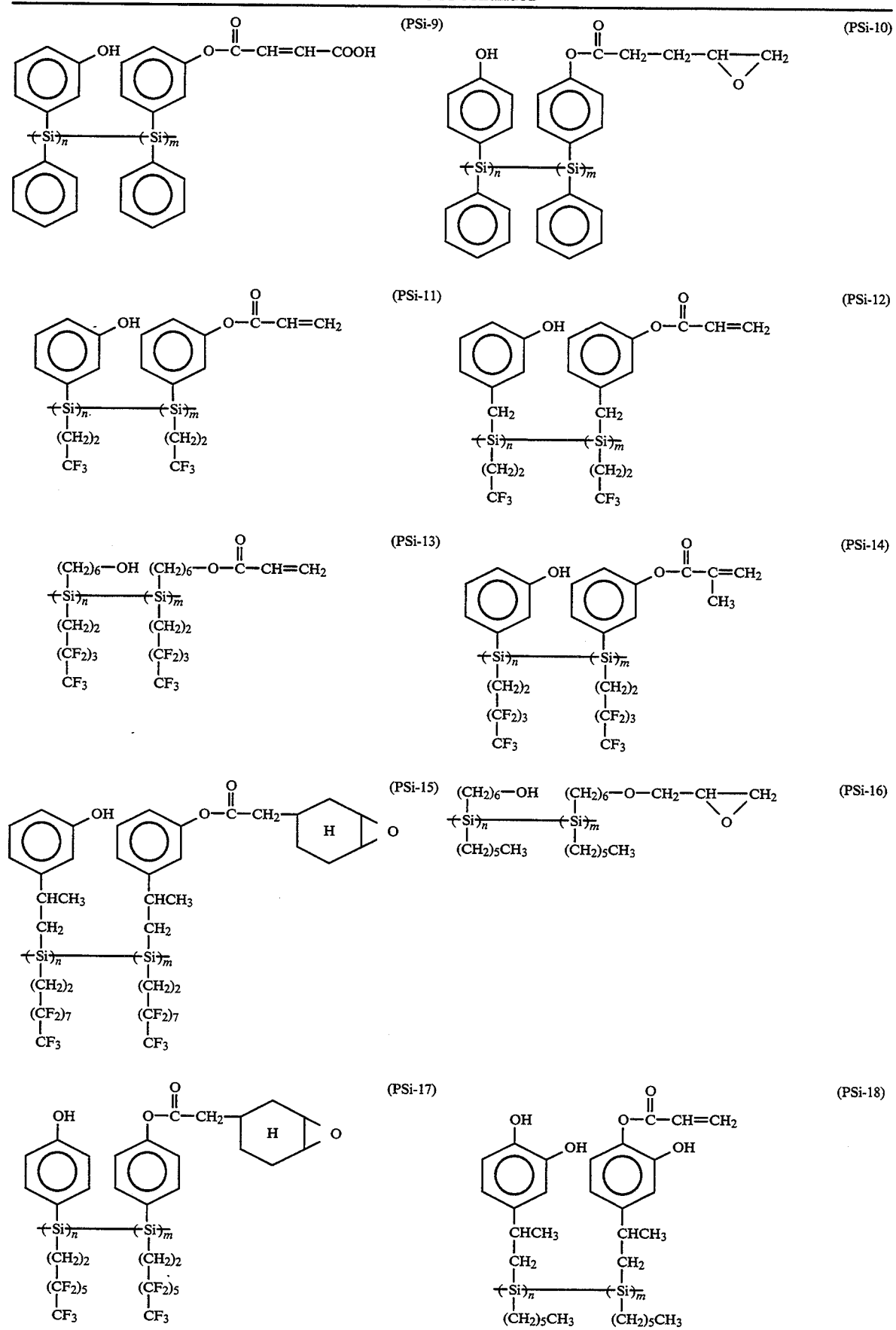

TABLE A-continued
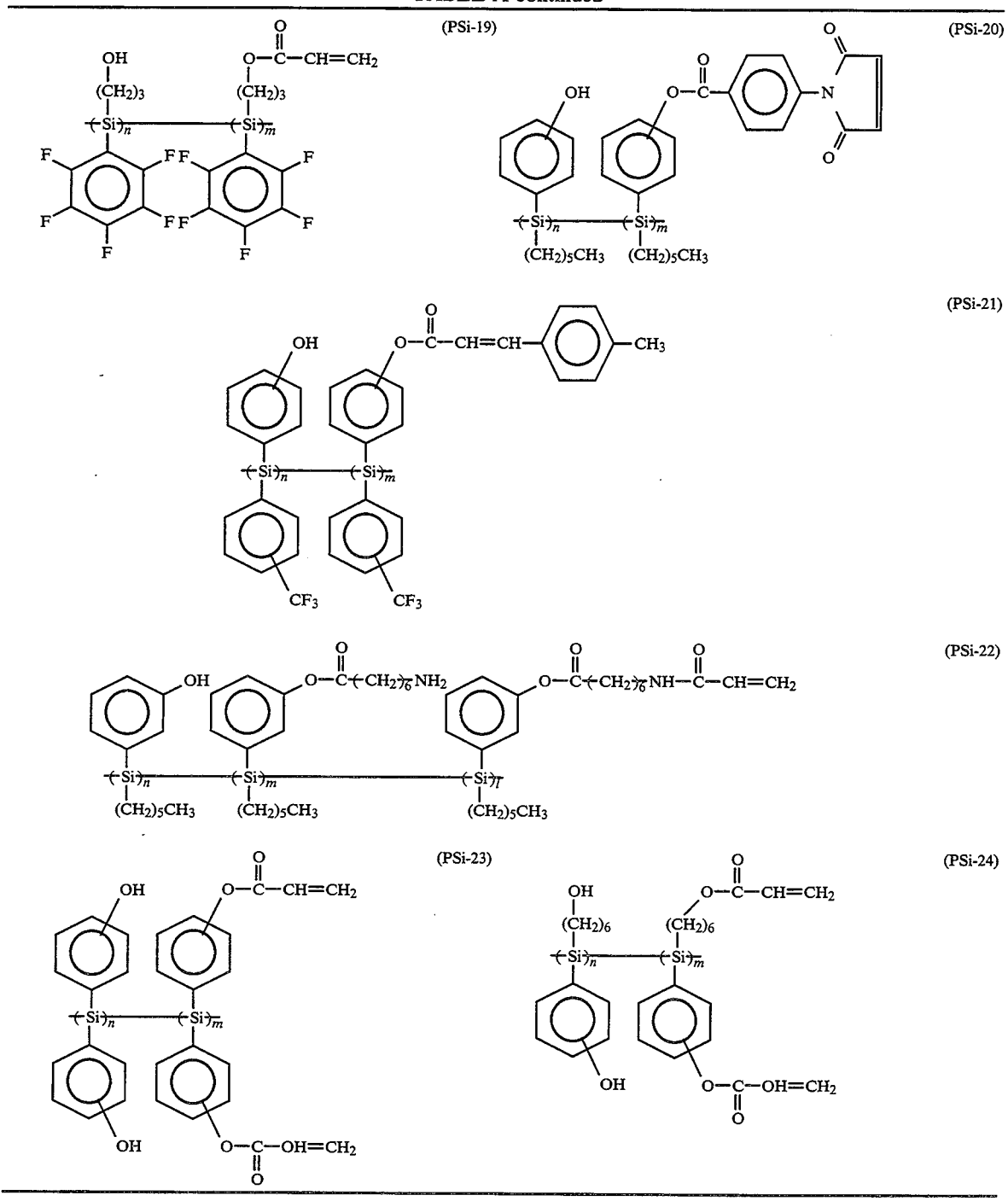
where l, m, and n represent copolymer composition.
TABLE B
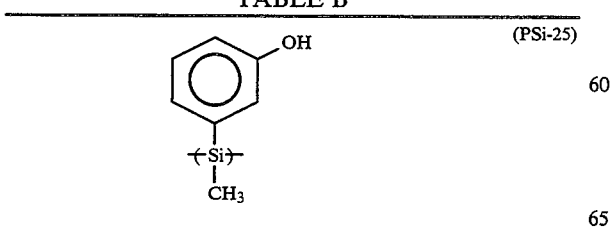
TABLE B-continued
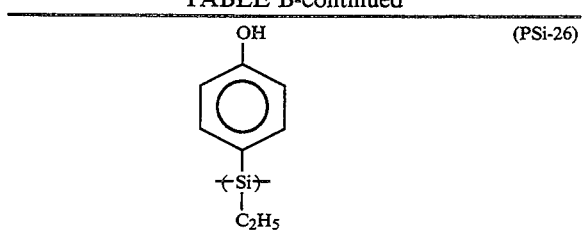

TABLE B-continued (PSi-27) [structure: benzene-1,2-diol with Si(CH3) substituent]

(PSi-28) [structure: phenol with Si(phenyl) substituent]

(PSi-29) [structure: phenol with -CH2CH2-Si(CH3)- substituent]

(PSi-30) [structure: phenol with -CH(CH3)CH2-Si(C6H13)- substituent]

(PSi-31) [structure: phenol with -CH2CH2CH2-Si(C6H13)- substituent]

(PSi-32) [structure: resorcinol with Si linker to another resorcinol]

TABLE C (S-1):
$$\text{Cl}-\underset{\underset{\text{H}}{|}}{\overset{\overset{\text{CH}_2\text{CH}_2\text{CH}_3}{|}}{\text{Si}}}-\text{Cl}$$

(S-2):
$$\text{Cl}-\underset{\underset{\text{Cl}}{|}}{\overset{\overset{(\text{CH}_2)_5\text{CH}_3}{|}}{\text{Si}}}-\text{Cl}$$

(S-3):
$$\text{Cl}-\underset{\underset{\text{Cl}}{|}}{\overset{\overset{(\text{CH}_2)_3\text{CH}_3}{|}}{\text{Si}}}-\text{Cl}$$

(S-4):
$$\text{Cl}-\underset{\underset{\text{Cl}}{|}}{\overset{\overset{(\text{SH}_2)_2(\text{CF}_2)_3\text{CF}_3}{|}}{\text{Si}}}-\text{Cl}$$

(G-1): [structure: phenyl with O-Si(CH3)2-C(CH3)3 group and isopropenyl group, $=CH_2$ with $CH_3$]

(G-2): [structure: 3-bromophenol]

(G-3): [structure: 3-bromophenyl-O-Si(CH3)2-C(CH3)3]

(G-4): [structure: 4-bromophenyl-O-Si(CH3)2-C(CH3)3]

(G-5):
$$\text{Br}-(\text{CH}_2)_6-\text{O}-\underset{\underset{\text{CH}_3}{|}}{\overset{\overset{\text{CH}_3\text{CH}_3}{|}}{\text{Si}}}-\overset{\overset{\text{CH}_3}{|}}{\underset{\underset{\text{CH}_3}{|}}{\text{C}}}-\text{CH}_3$$

TABLE C-continued (M-1): [structure: 3-substituted phenyl with O-Si(CH3)2-C(CH3)2-CH3 (tert-butyldimethylsilyl) ether; benzylic CHCH3-CH2-Si(Cl)(Cl)(C4H9)]

(M-2): [structure: phenyl with O-Si(tert-butyldimethylsilyl) group; ring-Si(Cl)(Cl)(C6H13)]

(M-3): [structure: phenyl with O-Si(tert-butyldimethylsilyl); ring-Si(Cl)(Cl)(C4H9)]

(G-4): [structure: (CH3)3C-Si(CH3)2-O-phenyl-Si(Cl)(Cl)-(CH2)2-(CF2)3-CF3]

(M-5): (CH2)5CH3 — Cl-Si-Cl — (CH2)6-O-Si-C(CH3)3 with CH3, CH3 substituents (P-1): HO-phenyl-CHCH3-CH2-Si(C4H9)-

(P-2): HO-phenyl-Si-(C6H13)

(P-3): HO-phenyl-Si-(C4H9)

(P-4): HO-phenyl-Si-(CH2)2(CF2)3CF3

(P-5): (CH2)5CH3-Si-(CH2)6-OH (F-1): Cl-C(=O)-CH=CH2

(F-2): Cl-C(=O)-C(CH3)=CH2

(F-3): phenyl-CH=CH-COCl (F-4): epoxycyclohexane-C(=O)Cl (PC-1): HO-phenyl-...-O-C(=O)-CH=CH2; two phenyl-CHCH3-CH2-Si(C4H9) units with subscripts n and m TABLE C-continued
(PC-2):
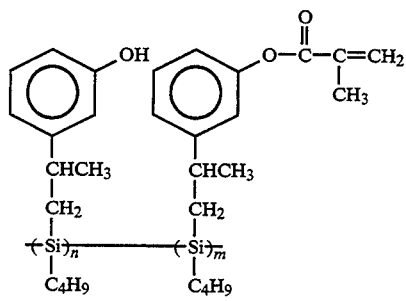
(PC-3):
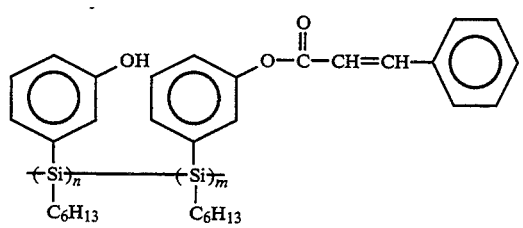
(PC-4):
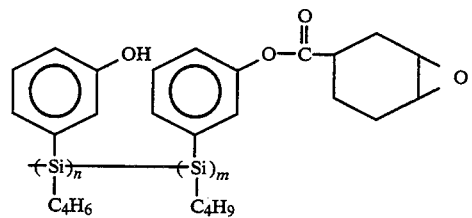
(PC-5):
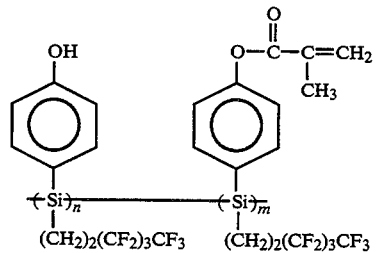
(PC-6):
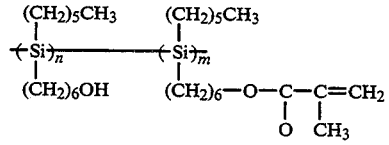
(PH-1):
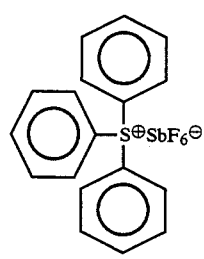
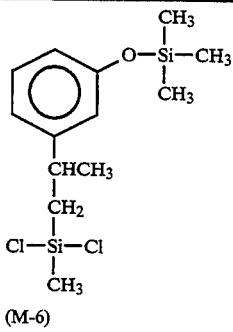
(M-6)
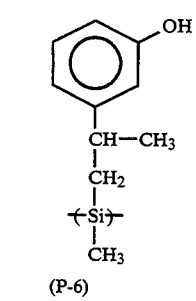
(P-6)
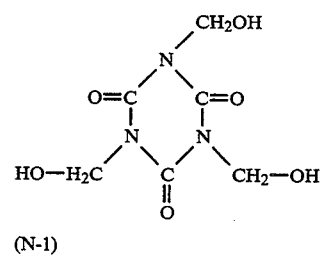
(N-1)
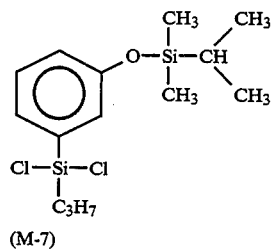
(M-7)
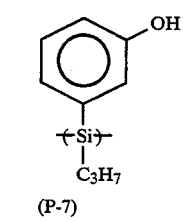
(P-7)
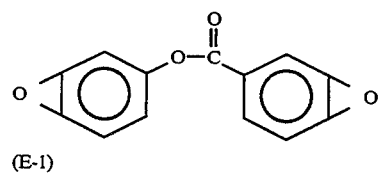
(E-1)
(I-1)
where m and n represent copolymer composition.
What is claimed is:

1. A polysilane composition comprising a polysilane having a repeating unit represented by general formula (2) given below and a crosslinking agent of a polyfunctional compound capable of reaction with the phenolic hydroxyl group:

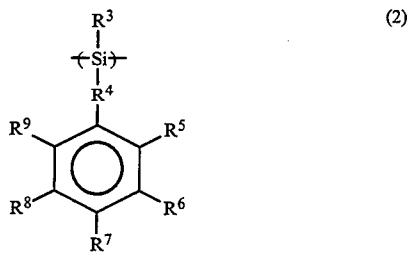

where, $R^3$ is hydrogen, a substituted or unsubstituted alkyl group having 1 to 24 carbon atoms, or a substituted or unsubstituted aryl group having 6 to 24 carbon atoms, $R^4$ is a covalent bond, or a substituted or unsubstituted alkylene group having 1 to 24 carbon atoms or a substituted or unsubstituted arylene group having 6 to 24 carbon atoms; and each of $R^5$ to $R^9$ is hydrogen, hydroxyl group, a substituted or unsubstituted alkyl group having 1 to 24 carbon atoms, or a substituted or unsubstituted aryl group having 6 to 24 carbon atoms, at least one of $R^5$ to $R^9$ being hydroxyl group.

2. The polysilane composition according to claim 1, wherein said polyfunctional compound is a polyfunctional epoxy resin.

3. The polysilane composition according to claim 1, wherein said polyfunctional compound is a polyfunctional isocyanate compound.

4. The polysilane composition according to claim 1, wherein said polyfunctional compound is a polyfunctional acid anhydride.

5. The polysilane composition according to claim 1, wherein said crosslinking agent is contained in said composition in an amount of 0.01 to 2 equivalents relative to the phenol nucleus of the polysilane having a repeating unit represented by general formula (2).

6. A three dimensional polysilane, which is synthesized by exposing a composition comprising a polysilane having a repeating unit represented by general formula (2) given below and a crosslinking agent of a polyfunctional compound capable of reaction with the phenolic hydroxyl group to light, or heating the same polysilane composition so as to have molecules of the polysilane crosslinked by the crosslinking agent;

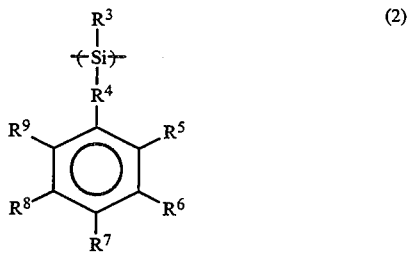

where, $R^3$ is hydrogen, a substituted or unsubstituted alkyl group having 1 to 24 carbon atoms, or a substituted or unsubstituted aryl group having 6 to 24 carbon atoms; $R^4$ is a covalent bond, or a substituted or unsubstituted alkylene group having 1 to 24 carbon atoms, or a substituted or unsubstituted arylene group having 6 to 24 carbon atoms; and each of $R^5$ and $R^9$ is hydrogen, hydroxyl group, a substituted or unsubstituted alkyl group having 1 to 24 carbon atoms, or a substituted or unsubstituted aryl group having 6 to 24 carbon atoms, at least one of $R^5$ to $R^9$ being hydroxyl group.

7. A cured thin film, which is obtained by exposing a polysilane thin film comprising a composition containing polysilane having a repeating unit represented by general formula (2) given below and a crosslinking agent of a polyfunctional compound capable of reaction with the phenolic hydroxyl group to light, or heating the same polysilane thin film so as to have molecules of the polysilane crosslinked by the crosslinking agent:

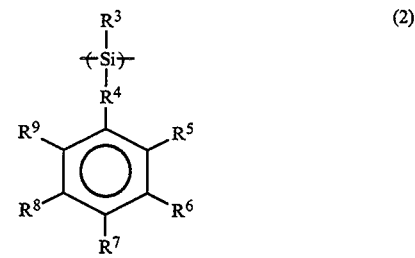

where, $R^3$ is hydrogen, a substituted or unsubstituted alkyl group having 1 to 24 carbon atoms, or a substituted or unsubstituted aryl group having 6 to 24 carbon atoms; $R^4$ is a covalent bond, or a substituted or unsubstituted alkylene group having 1 to 24 carbon atoms, or a substituted or unsubstituted arylene group having 6 to 24 carbon atoms; and each of $R^5$ to $R^9$ is hydrogen, hydroxyl group, a substituted or unsubstituted alkyl group having 1 to 24 carbon atoms, or a substituted or unsubstituted aryl group having 6 to 24 carbon atoms, at least one of $R^5$ to $R^9$ being hydroxyl group.

8. The cured thin film according to claim 7, wherein said polysilane thin film is obtained by transferring or building up on a predetermined substrate a monomolecular film which is formed by spreading a solution prepared by dissolving said polysilane composition in an organic solvent on the surface of a liquid material.

9. A polysilane composition comprising a polysilane having a repeating unit represented by general formula (2) given below and a crosslinking agent of an electrophilic agent capable of an electrophilic reaction with the phenol nucleus:

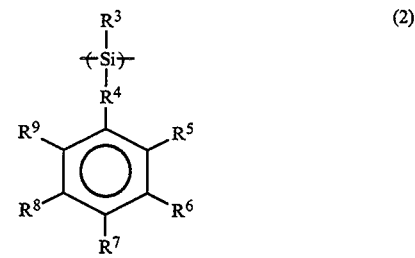

where, $R^3$ is hydrogen, a substituted or substituted alkyl group having 1 to 24 carbon atoms, or a substituted or unsubstituted aryl group having 6 to 24 carbon atoms, $R^4$ is a covalent bond, or a substituted or unsubstituted alkylene group having 1 to 24 carbon atoms or a substituted or unsubstituted arylene group having 6 to 24 carbon atoms; and each of $R^5$ to $R^9$ is hydrogen, hydroxyl, group, a substituted or unsubstituted alkyl group having 1 to 24 carbon atoms, or a substituted or unsubstituted aryl group having 6 to 24 carbon atoms, at least one of $R^5$ to $R^9$ being hydroxyl group.

10. The polysilane composition according to claim 9, wherein said electrophilic agent is an aldehyde compound.

11. The polysilane composition according to claim 9, wherein said electrophilic agent is a methylol compound having at least two groups of $=N-CH_2-OH$ in a molecule.

12. A three dimensional polysilane, which is synthesized by exposing a composition comprising a polysilane having a repeating unit represented by general formula (2) given below and a crosslinking agent of an electrophilic agent capable of an electrophilic reaction with the phenol nucleus to light, or heating the same polysilane composition so as to have molecules of the polysilane crosslinked by the crosslinking agent:

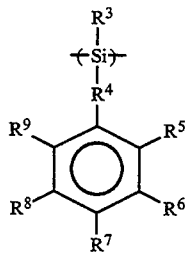

(2)

where, $R^3$ is hydrogen, a substituted or substituted alkyl group having 1 to 24 carbon atoms, or a substituted or unsubstituted aryl group having 6 to 24 carbon atoms, $R^4$ is a covalent bond, or a substituted or unsubstituted alkylene group having 1 to 24 carbon atoms or a substituted or unsubstituted arylene group having 6 to 24 carbon atoms; and each of $R^5$ to $R^9$ is hydrogen, hydroxyl, group, a substituted or unsubstituted alkyl group having 1 to 24 carbon atoms, or a substituted or unsubstituted aryl group having 6 to 24 carbon atoms, at least one of $R^5$ to $R^9$ being hydroxyl group.

13. A cured thin film, which is obtained by exposing a polysilane thin film comprising a composition containing polysilane having a repeating unit represented by general formula (2) given below and a crosslinking agent of an electrophilic agent capable of an electrophilic reaction with the phenol nucleus to light, or heating the same polysilane thin film so as to have molecules of the polysilane crosslinked by the crosslinking agent:

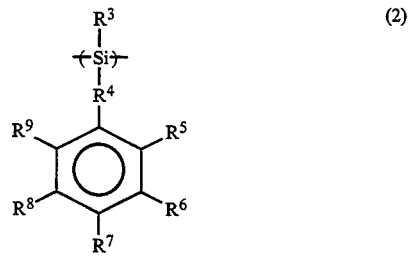

(2)

where, $R^3$ is hydrogen, a substituted or substituted alkyl group having 1 to 24 carbon atoms, or a substituted or unsubstituted aryl group having 6 to 24 carbon atoms, $R^4$ is a covalent bond, or a substituted or unsubstituted alkylene group having 1 to 24 carbon atoms or a substituted or unsubstituted arylene group having 6 to 24 carbon atoms; and each of $R^5$ to $R^9$ is hydrogen, hydroxyl, group, a substituted or unsubstituted alkyl group having 1 to 24 carbon atoms, or a substituted or unsubstituted aryl group having 6 to 24 carbon atoms, at least one of $R^5$ to $R^9$ being hydroxyl group.

14. The polysilane composition according to claim 9, wherein said crosslinking agent is contained in said composition in an amount of 0.01 to 2 equivalents relative to the phenol nucleus of the polysilane having a repeating unit represented by general formula (2).

15. The cured thin film according to claim 13, wherein said polysilane film is obtained by transferring or building up on a predetermined substrate a monomolecular film which is formed by spreading a solution prepared by dissolving said polysilane composition in an organic solvent on the surface of a liquid material.

* * * * *